United States Patent
Sundaram (10) Patent No.: US 10,523,338 B2
(45) Date of Patent: Dec. 31, 2019

(54) LENS FOR FREE AIR OPTICAL INTERCONNECT

(71) Applicants: Intel Corporation, Santa Clara, CA (US); Arvind Sundaram, Bangalore (IN)

(72) Inventor: Arvind Sundaram, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/325,154

(22) PCT Filed: Sep. 29, 2016

(86) PCT No.: PCT/US2016/054354
§ 371 (c)(1),
(2) Date: Feb. 12, 2019

(87) PCT Pub. No.: WO2018/063220
PCT Pub. Date: Apr. 5, 2018

(65) Prior Publication Data
US 2019/0190236 A1    Jun. 20, 2019

(51) Int. Cl.
| H04B 10/80 | (2013.01) |
| H01S 5/40 | (2006.01) |
| H04B 10/114 | (2013.01) |
| H01S 5/00 | (2006.01) |

(52) U.S. Cl.
CPC ......... *H04B 10/803* (2013.01); *H01S 5/4087* (2013.01); *H04B 10/1143* (2013.01); *H04B 10/801* (2013.01); *H01S 5/005* (2013.01)

(58) Field of Classification Search
CPC ............ H04B 10/11–118; H04B 10/40; H04B 10/803; H04B 10/804
See application file for complete search history.

(56) References Cited

U.S. PATENT DOCUMENTS

| 4,460,259 A | | 7/1984 | Greivenkamp, Jr. et al. |
| 5,963,349 A | * | 10/1999 | Norte ..................... H04B 10/40 398/1 |
| 2003/0081288 A1 | * | 5/2003 | Ishii ..................... H04B 10/114 398/135 |
| 2005/0084268 A1 | | 4/2005 | Weigert |
| 2007/0003289 A1 | | 1/2007 | Tan et al. |
| 2009/0142065 A1 | | 6/2009 | Kreusser |

(Continued)

FOREIGN PATENT DOCUMENTS

WO    WO-2018063220 A1    4/2018

OTHER PUBLICATIONS

"International Application Serial No. PCT/US2016/054354, International Search Report dated May 23, 2017", 3 pgs.

(Continued)

*Primary Examiner* — Casey L Kretzer
(74) *Attorney, Agent, or Firm* — Schwegman Lundberg & Woessner, P.A.

(57) ABSTRACT

An apparatus comprises a substrate; a laser emitter arranged on the substrate; a photodiode arranged on the substrate; resin encapsulating the laser emitter and the photodiode, wherein the resin includes a top surface above the laser emitter and photodiode; and a lens arranged on the top surface of the resin.

17 Claims, 8 Drawing Sheets

(56) References Cited

U.S. PATENT DOCUMENTS

2011/0150493 A1    6/2011  Nakaso et al.
2017/0261707 A1*  9/2017  Onaka .................. G02B 6/4215

OTHER PUBLICATIONS

"International Application Serial No. PCT/US2016/054354, Written Opinion dated May 23, 2017", 10 pgs.

"International Application Serial No. PCT US2016 054354, International Preliminary Report on Patentability dated Apr. 11, 2019", 12 pgs.

* cited by examiner

LENS FOR FREE AIR OPTICAL INTERCONNECT

CLAIM OF PRIORITY

This patent application is a U.S. National Stage Application under 35 U.S.C. 371 from International Application No. PCT/US2016/054354, filed Sep. 29, 2016, published as WO2018/063220, which is incorporated herein by reference.

TECHNICAL FIELD

Embodiments pertain to high speed interconnections in electronic systems, and more specifically to optical communication interfaces between electronic devices.

BACKGROUND

Electronic systems often include electronic devices that communicate signals to each other. Designers of electronic systems strive to increase the speed of the communication among devices while keeping the communication link robust. Wireless connections can be more robust than wired connections because of the elimination of the need for mechanical contact that may be susceptible to wear. Wireless interfaces typically communicate using radio frequency (RF) signals. However, some limitations of RF communication interfaces include bandwidth limitations, signal interference, and overhead associated with RF protocols. Optical signals can be an alternative to RF and can achieve higher data rates. However, traditional optical interconnects require special fiber-optic cables, which can be more expensive than wired interfaces, and can require air tight glass-to-glass connections to prevent Fresnel reflections, making them less desirable and, in certain examples, impractical for day-to-day free-air interconnects. There is a general need for devices, systems and methods to address requirements for high-speed interconnections among electronic devices.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

There are many types of communication interfaces between electronic devices. These include universal serial bus (USB), mobile industry processor interface (MIPI), peripheral component interconnect (PCI), PCI express (PCIe), high definition multimedia interface (HDMI), thunderbolt (TBT), display port (DP) interface, and other serial busses and serial-parallel busses used in consumer electronics, enterprise class devices, wearable electronic devices, smartphones, portable computers, and tablet computers. It is desirable to implement a wireless communication interface that can provide improved data rate and can adapt basic wireless interconnection with all of the protocols available and yet not be tied to any one specific protocol. An infrared-based interface is an alternative to an RF interface, but an IR-based interface involves conversion between protocols, which adds overhead to the communication. A laser-based optical interface would meet these requirements for the interconnection, but the cost of fiber optic based optical interconnections can be prohibitive.

A better option is a laser-based optical interface that does not use fiber optics to transmit and receive the laser emitted signals, but instead transmits the optical signals via free air space (e.g., a light amplitude modulation docking adapter, or LAMDA). This can be accomplished by communicating the optical signals over short distances (e.g., about ten millimeters, or 10 mm) so that signal loss is tolerable. The free air optical interface can scale to data rates up to ten gigabits per second (10 Gbps) and rates of one terabit per second (1 Tbps) may be available. This type of optical interface is not tied to any specific protocol and eliminates protocol overhead, which reduces the latency in communication to near zero latency. Further, the interface is agnostic to clock rate, making the interface compatible with high speed and low speed interfaces.

Figure 1:
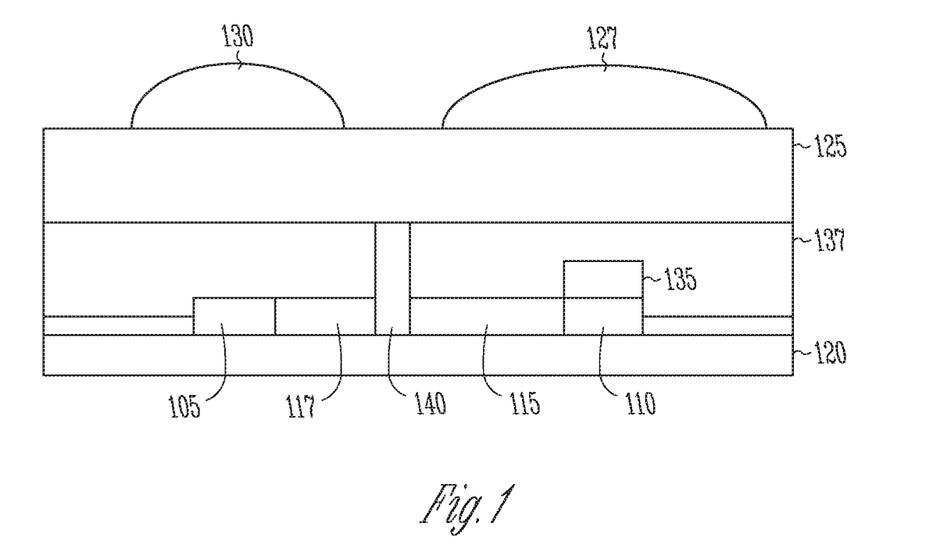
FIG. 1 is an illustration of an optical transmitter (TX) receiver (RX) pair in accordance with some embodiments.

FIG. 1 illustrates an embodiment of an optical transmitter (TX) receiver (RX) pair. The optical TX/RX pair can include a laser emitter 105, such as a laser diode or a vertical-cavity surface emitting laser (VCSEL) for example. The optical receiver can include a photodiode 110 to convert received laser energy into an electrical signal. A trans-impedance amplifier 115 (TIA) can be used to amplify the electrical signal generated by the photodiode 110. A drive amplifier 117 may also be included to translate signals to be transmitted to levels of power or voltage needed to drive the laser emitter 105. The laser emitter 105 and the photodiode 110 are arranged on a substrate 120. Some examples of the substrate 120 include a printed circuit board (PCB) made of plastic, a plastic laminate (e.g., FR4), or ceramic.

A resin 137 may be disposed on the substrate to encapsulate the electronics. The resin may be an optically clear resin (OCR) that flows before hardening. However, OCR may be susceptible to scratching. Because the optical interface is exposed to air rather than being protected using connections to fiber-optics, the optical TX/RX pair may need a surface with a higher degree of hardness than a resin can provide.

The optical TX/RX pair can include a lens 125. The lens may have a surface hardness rating of 8H or higher. The lens 125 can include a first lens portion 127 having a first curvature arranged above the photodiode 110 and a second lens portion 130 having a second curvature arranged above the laser emitter 105. The lens may be pre-formed prior to assembly and may include alumina silicate glass or a copolymer coated poly(methyl methacrylate) (PMMA), such as sol-gel coated PMMA for example. The lens may have the same refractive index as the OCR to prevent reflections at the OCR/lens interface. The lens may also provide protection from humidity. An isolation barrier 140 may be arranged on the substrate between the laser emitter and the photodiode. The isolation barrier 140 may extend from the substrate to the top surface of the resin and may also serve as a support for the lens during curing of the resin.

Figure 2:
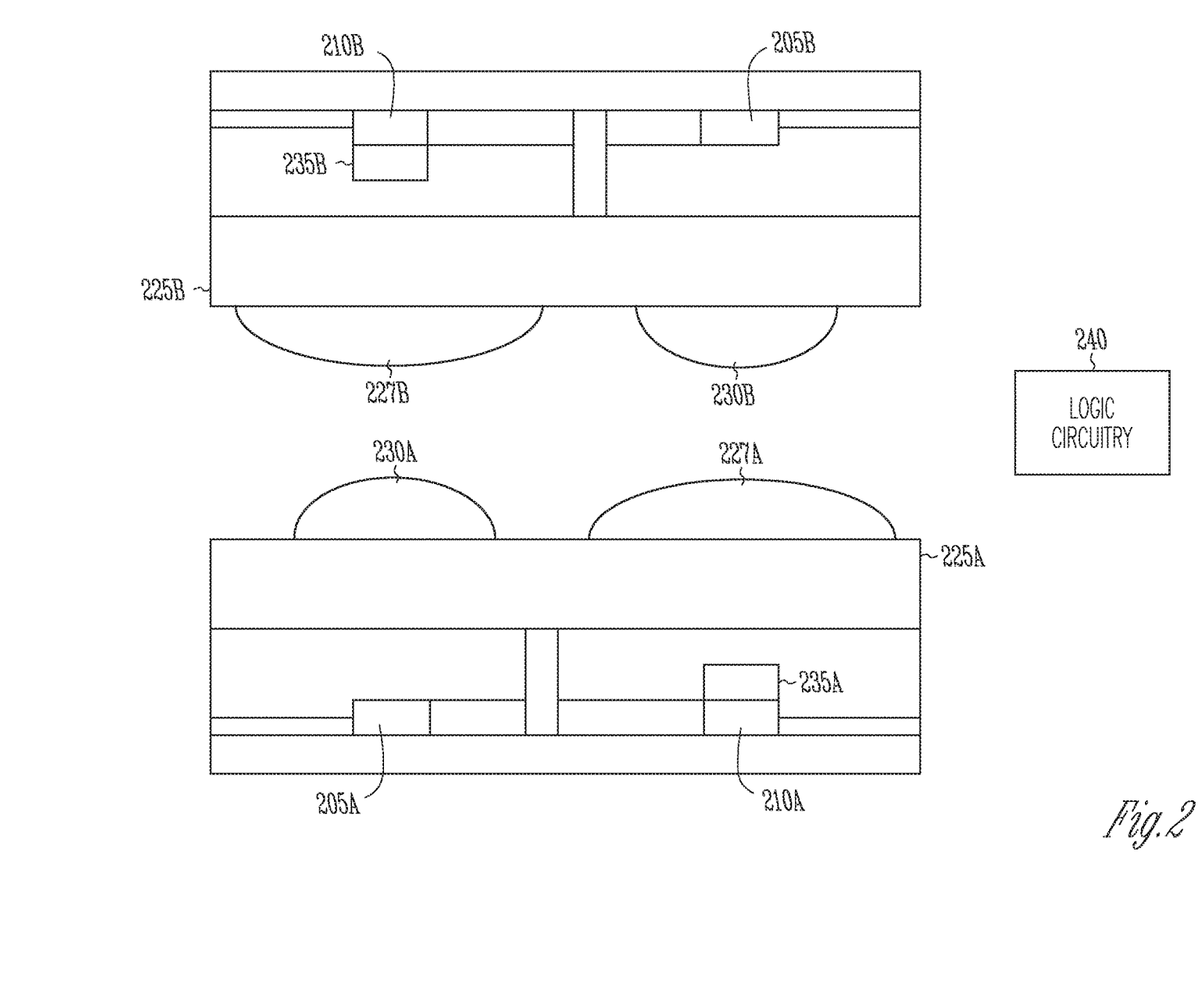
FIG. 2 shows an example of two optical TX/RX pairs arranged to form a duplex optical interface in accordance with some embodiments.

FIG. 2 shows an example of two optical TX/RX pairs arranged to form a duplex serial optical interface. A second optical TX/RX pair is positioned opposite the optical TX/RX pair in FIG. 1. The optical transmitter of the second optical TX/RX pair (e.g., laser emitter 205B) is arranged opposite the optical receiver of the first optical TX/RX pair (e.g., photodiode 210A) to create a first communication lane, and the optical transmitter of the first optical TX/RX pair (e.g., laser emitter 205A) is arranged opposite the optical receiver of the second TX/RX pair (e.g., photodiode 210B) to form a second communication lane in the reverse direction from the first communication lane. An air gap separates the two TX/RX pairs. The separation between the two optical TX/RX pairs is small (e.g., about 2.5 mm). The small separation allows for the optical receivers to reliably detect the laser energy from the laser emitters. The optical TX/RX pairs also include lenses 225A, 225B. Portions of the lenses may have different curvature. The first lens portion 227A may focus laser energy received across the air gap from a laser emitter onto a photodiode, and the second lens portion 230A may focus laser energy from a laser emitter transmitted across the air gap toward a photodiode.

An optical TX/RX pair may be electrically connected to logic circuitry 240. The logic circuitry 240 transmits and receives signals communicated according to a duplex communication protocol, such as a USB protocol. In certain embodiments, the logic circuitry 240 may be arranged on one or both of the substrates. In some variations, one or both of the substrates are electronics package substrates and the laser emitters, the photodiodes, and the logic circuitry may be included in the same electronics package.

Returning to FIG. 1, it may be desirable to use a photodiode 110 that has a wide spectral response (e.g., an indium gallium arsenide (InGaAs) photodiode). The wide spectral response is desirable for detection of laser energy transmitted over air, but can cause problems of crosstalk between communication lanes, such as the two communication lanes of FIG. 2. To reduce or eliminate crosstalk between communication lanes, a laser bandpass filter 135 is arranged above the photodiode 110 of each TX/RX pair. In some embodiments, the laser bandpass filter can be a Lyot filter or a dichroic filter arranged above the photodiode. In some embodiments, the laser bandpass filter 135 is formed on a surface of the lens 125 that contacts the resin. The coating may be a thin film coating (e.g., an anti-reflective coating, or ARC) formed using ion beam sputtering (IBS) included on the surface of the lens contacting the resin.

The laser bandpass filter 135 of the TX/RX pair has a passband that excludes the center frequency of the laser energy emitted by the laser emitter of the same TX/RX pair, but the passband includes the center frequency of the laser energy emitted by the laser emitter opposite the photodiode in the communication lane of the photodiode. Thus, the laser bandpass filter 135 reduces or eliminates laser energy from one communication lane from being detected by the other communication lane.

The center frequency of a laser emitter may be assigned based on the type of device. For example, in FIG. 2, the bottom TX/RX pair may be included in a host device and the top TX/RX pair may be included in a peripheral device (e.g., a disc drive). The laser emitter 205A of the host device TX/RX pair may emit laser energy at a first center frequency and may include a laser bandpass filter 235A that excludes the first center frequency. The laser emitter 205B of the peripheral device TX/RX pair may emit laser energy at a second center frequency and may have a laser bandpass filter 235B that excludes the second center frequency and passes the first center frequency. The laser bandpass filter 235A of the host device TX/RX pair passes the second center frequency. Therefore, the passband of the laser bandpass filter may be selected according to the type of device in which the TX/RX pair is included.

Figure 3:
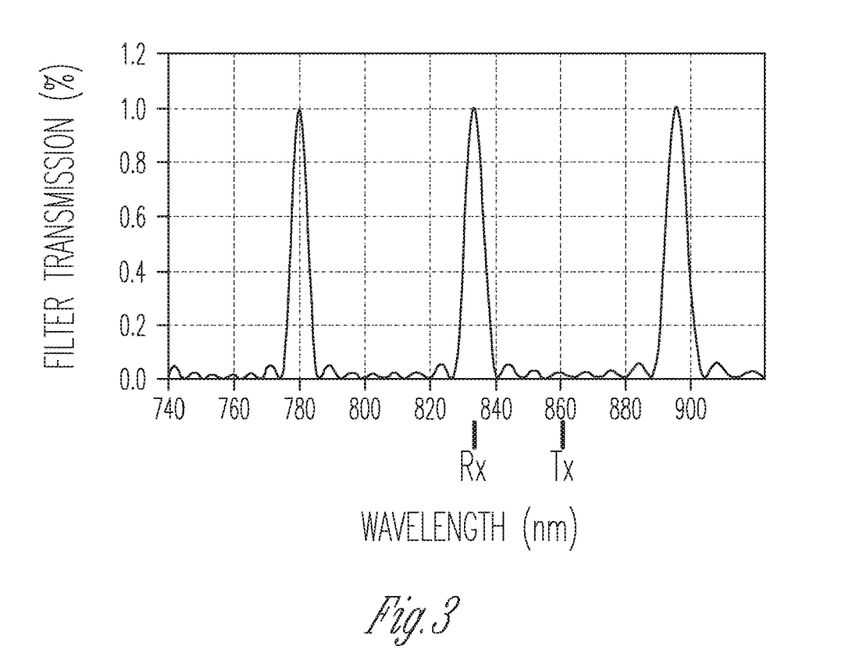
FIG. 3 is a filter characteristic of a laser bandpass filter of an optical TX/RX pair in accordance with some embodiments.

FIG. 3 is an example of a filter characteristic for a laser bandpass filter of an optical TX/RX pair. The example is intended to be illustrative and non-limiting. The filter characteristic shows filter transmission versus wavelength. In the example, a laser emitter of a TX/RX pair emits laser energy with a wavelength of 855 nanometers (nm), and the photodiode of the TX/RX pair is to receive laser energy with a wavelength of 830 nm. The filter shows very high attenuation at 855 nm and shows that the filter passband includes 830 nm.

Figure 4:
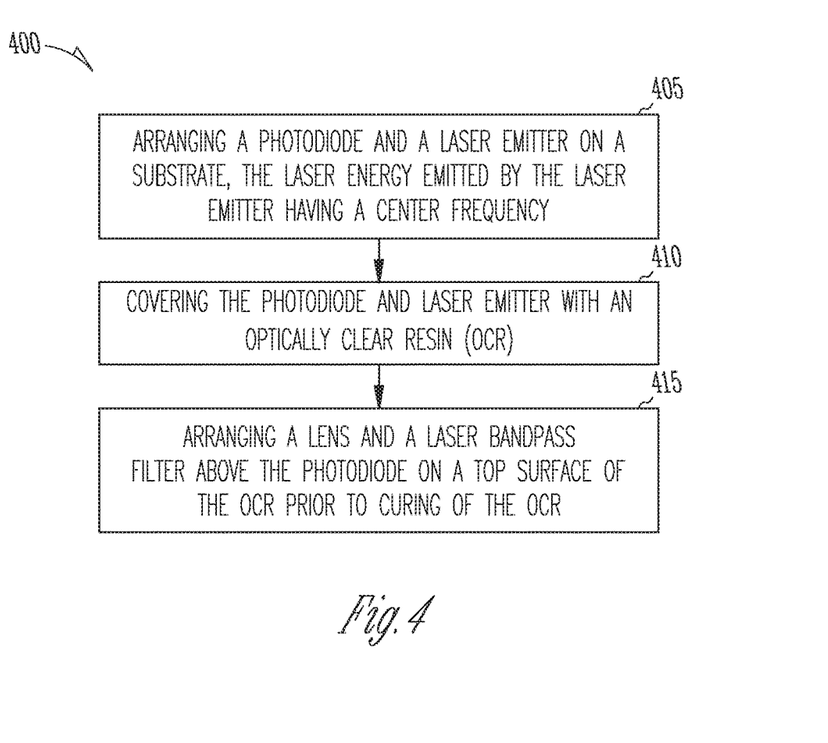
FIG. 4 is a flow diagram of a method of making an optical TX/RX pair in accordance with some embodiments.

FIG. 4 is a flow diagram of an embodiment of a method 400 of making an optical TX/RX pair. At 405, a photodiode and a laser emitter are arranged on a substrate. The laser energy emitted by the laser emitter has a specified center frequency. In some embodiments, the laser emitter is a VCSEL and the photodiode is a type of photodiode having a wide spectral response. The substrate may be a printed circuit board (PCB) and the photodiode and the laser emitter may be mounted on the top side of the PCB, and the PCB may include solder pads on the bottom side. In certain embodiments the substrate includes ceramic, and in certain embodiments the substrate includes plastic. In some embodiments, a TIA and a driver amplifier are also arranged on the substrate.

Figure 5A:
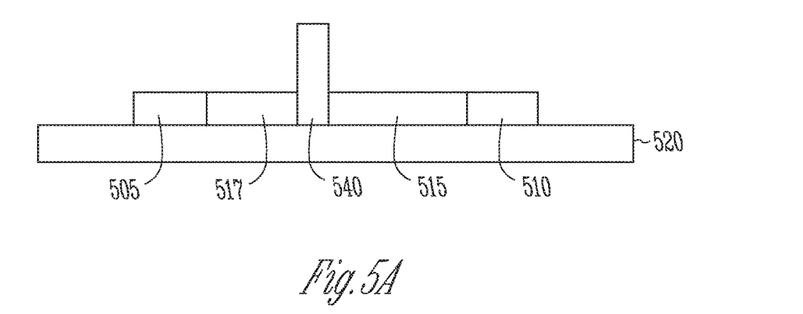
FIGS. 5A-5C are stages of making the optical TX/RX pair in accordance with some embodiments.
Figure 5B:
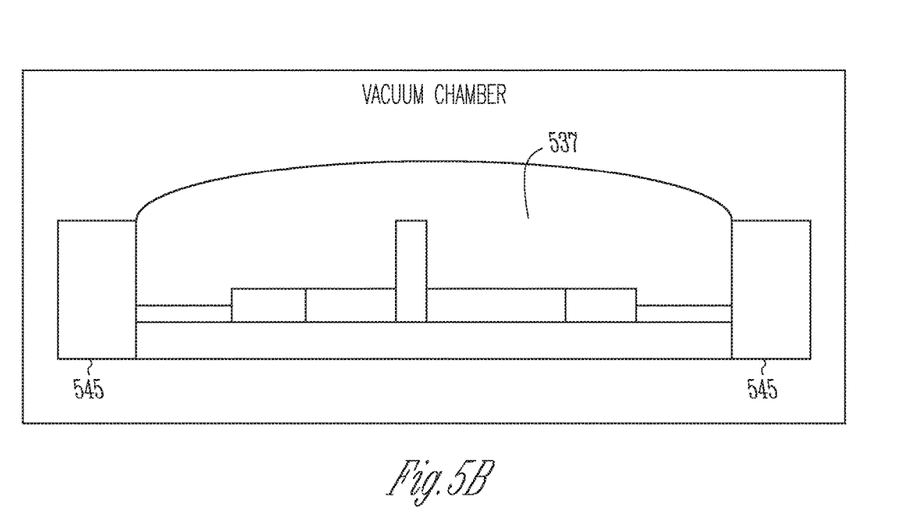
Figure 5C:
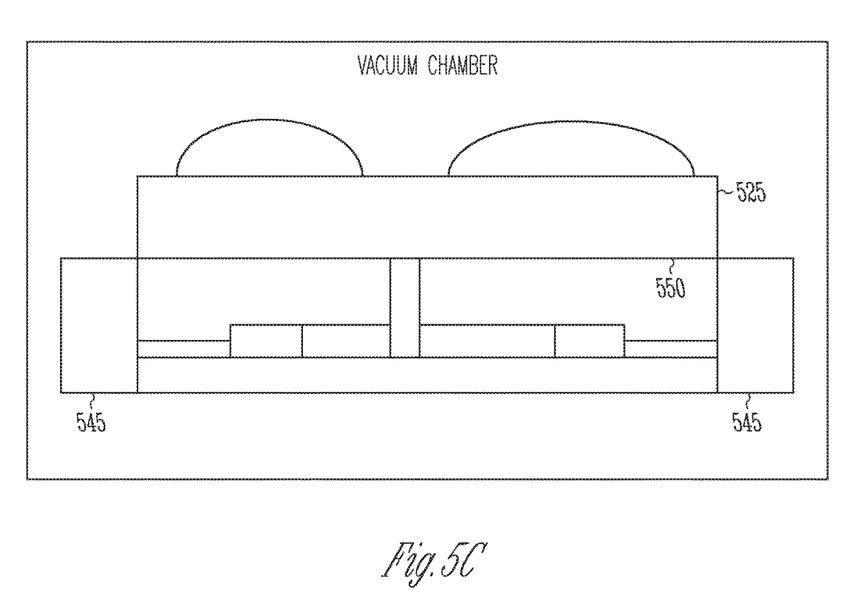

FIGS. 5A-5C illustrate the optical TX/RX pair at different stages. FIG. 5A is an embodiment of an electronic subassembly of the optical TX/RX pair. The subassembly includes a laser emitter 505, a photodiode 510, a TIA 515, a driver amplifier 517, and an isolation barrier 540 arranged on a substrate 520. The TIA 515 is electrically coupled to the photodiode 510 and the driver amplifier 517 is electrically coupled to the laser emitter. In certain embodiments, the TIA 515 is arranged between the laser emitter 505 and the photodiode 510. In certain embodiments, the isolation barrier is arranged between the laser emitter and the photodiode, and the TIA is included on the photodiode side of the substrate.

Returning to FIG. 4 at 410, the photodiode and the laser emitter are covered with OCR. FIG. 5B is an illustration of the OCR 537 deposited on the subassembly using a mold 545 while the subassembly is in a vacuum chamber. Curing the OCR is a vacuum chamber prevents formation of air bubbles in the OCR. The OCR can be cured using one or both of ultraviolet (UV) light and temperature.

Returning to FIG. 4 at 415, a lens and a laser bandpass filter are arranged on the OCR above the photodiode. FIG. 5C is an illustration of the lens 525 placed on the subassembly prior to the OCR completely curing. The isolation barrier 540 may extend from the substrate to the top surface of the OCR to provide support for the lens 525. The passband of the laser bandpass filter excludes the center frequency of the laser energy. The method 400 of FIG. 4 may include coating a surface of the lens 525 to form the laser bandpass filter. In certain embodiments, the lens is coated using an IBS process prior to arranging the lens on the OCR. In some embodiments, the flat surface of the lens 550 above the photodiode is coated to form the laser bandpass filter. In some embodiments, the curved surface of the lens above the photodiode is coated to form the laser bandpass filter. The coating may form a dichroic filter or a Lyot filter on the lens.

Figure 6:
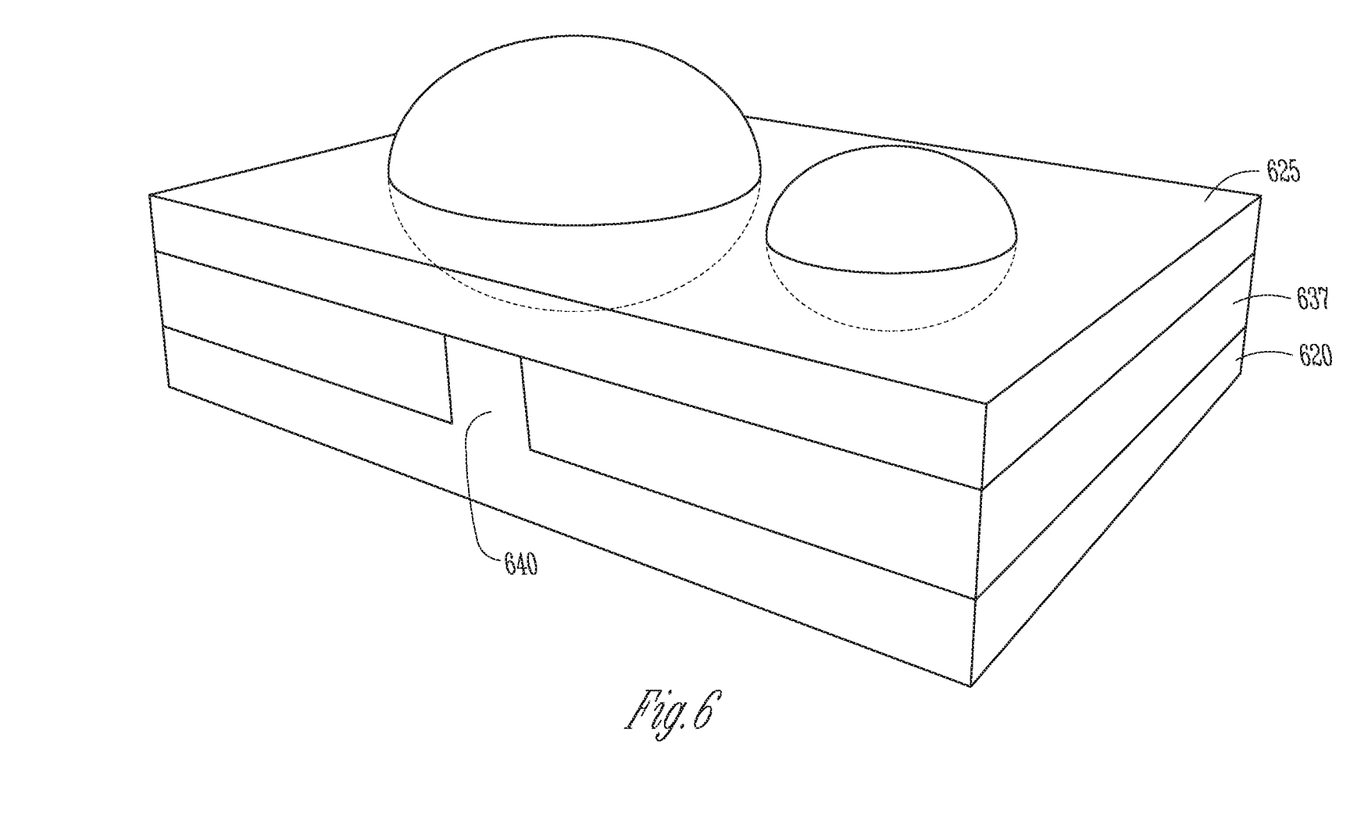
FIG. 6 is an illustration of an embodiment of a finished assembly of an optical TX/RX pair in accordance with some embodiments.
Figure 7:
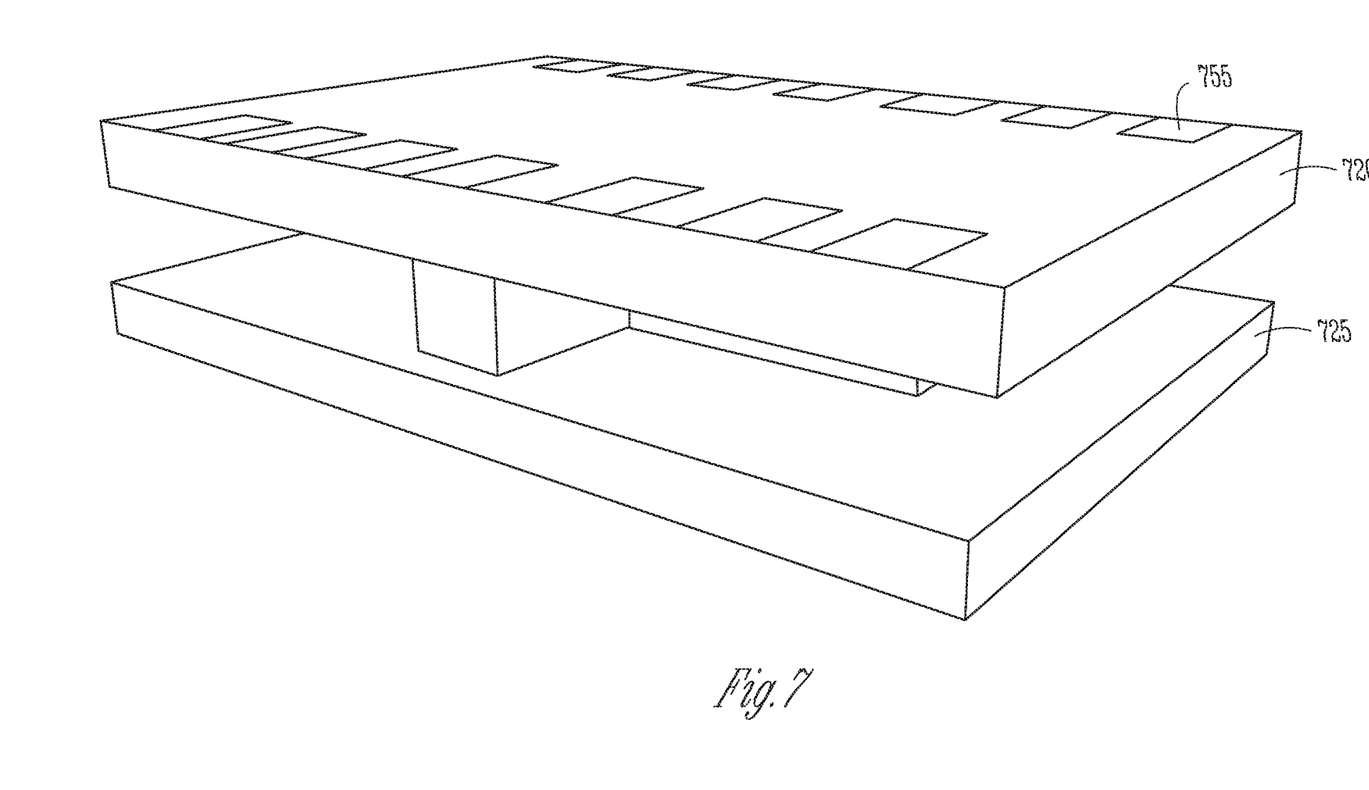
FIG. 7 is a bottom view of an optical TX/RX pair in accordance with some embodiments.

FIG. 6 is an illustration of an embodiment of a finished assembly of an optical TX/RX pair. The illustration shows the substrate 620, the isolation barrier 640, the resin 637, and lens 625 arranged on the resin and the isolation barrier 640. The electronics are encapsulated in the resin. Different lenses can be used for different product requirements. FIG. 7 is a bottom view of an embodiment of an optical TX/RX assembly including a substrate 720 and lens 725. The substrate 720 includes contact pads 755 to allow surface mounting of the TX/RX pair.

Returning to FIG. 4, the method 400 may further include placing a first optical TX/RX pair opposite a second optical TX/RX pair (e.g., as shown in FIG. 2) in a single electronics package. The TX/RX pairs may be separated by an air gap. This arrangement provides a duplex serial optical interface over an air space. The free air optical interface provides a robust communication link, and may be used to implement an optical interface for any one of a USB, a PCI or PCIe, an HDMI, a TBT interface, a DP interface or other serial and serial-parallel bus. The optical interface can be included in a personal computer (PC) or a mobile computing device such as a smart phone, tablet, compute stick, etc. The optical interface can be used to connect peripheral devices to the PC or mobile computing device. The optical interface can be included in a server, mini-server, or micro-server, and can be used for agnostic backplane connections to servers.

Figure 8:
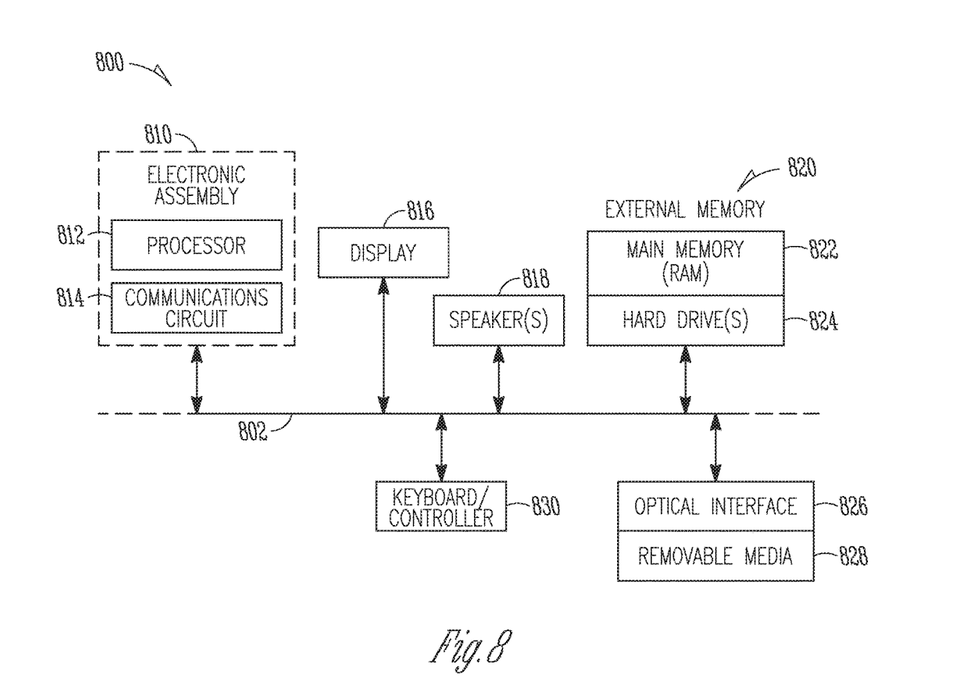
FIG. 8 is a block diagram of an example of an electronic system in accordance with some embodiments.

FIG. 8 is a block diagram of an example of an electronic system 800 incorporating at least one electronic circuit assembly and in accordance with at least one embodiment of the invention. Electronic system 800 is merely one example in which embodiments of the present invention can be used. Examples of electronic systems 800 include, but are not limited to personal computers, tablet computers, mobile telephones, smart phones, game devices, compute sticks etc., and server systems In this example, electronic system 800 comprises a data processing system that includes a system bus 802 to couple the various components of the system. System bus 802 provides communications links among the various components of the electronic system 800 and can be implemented as a single bus, as a combination of busses, or in any other suitable manner.

An electronic assembly 810 can be coupled to system bus 802. The electronic assembly 810 can include any circuit or combination of circuits. In one embodiment, the electronic assembly 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 810 are a custom circuit, an application-specific integrated circuit (ASIC), or the like. The electronic assembly can include a communications circuit 814 for use in wireless devices like servers, wireless network communication nodes, mobile telephones, smartphones, personal data assistants, portable computers, two-way radios, and similar electronic systems.

The electronic system 800 can also include an external memory 820, which in turn can include one or more memory elements suitable to the particular application, such as a main memory 822 in the form of random access memory (RAM), one or more hard drives 824. The electronic assembly 810 can also include an optical interface 826 for removable media 828 such as compact disks (CD), flash memory cards, digital video disk (DVD), and the like.

The electronic system 800 can also include a display device 816, one or more speakers 818, and a keyboard and/or controller 830, which can include a mouse, trackball, touch screen, voice-recognition device, or any other device that permits a system user to input information into and receive information from the electronic system 800.

ADDITIONAL DESCRIPTION AND EXAMPLES

Example 1 includes subject matter (such as an apparatus) comprising: a substrate; a laser emitter arranged on the substrate; a photodiode arranged on the substrate; resin encapsulating the laser emitter and the photodiode, wherein the resin includes a top surface above the laser emitter and photodiode; and a lens arranged on the top surface of the resin.

In Example 2, the subject matter of Example 1 optionally includes a laser emitter that emits laser energy having a center frequency, wherein the lens is arranged above the photodiode and includes a laser bandpass filter having a passband that excludes the center frequency of the laser energy.

In Example 3, the subject matter of one or both of Examples 1 and 2 optionally includes a lens including a first lens portion having a first curvature arranged above the photodiode and a second lens portion having a second curvature arranged above the laser emitter.

In Example 4, the subject matter of one or any combination of Examples 1-3 optionally includes a laser emitter that includes a vertical cavity surface emitting laser (VCSEL) that emits laser energy having a center frequency, wherein the first lens portion includes a laser bandpass filter having a passband that excludes the center frequency of the laser energy.

In Example 5, the subject matter of one or any combination of Examples 1-4 optionally includes a laser bandpass filter that includes a dichroic filter.

In Example 6, the subject matter of one or any combination of Examples 1-5 optionally includes a laser bandpass filter arranged above the photodiode and included on a surface of the lens contacting the resin, wherein the laser emitter emits laser energy having a center frequency, and wherein a passband of the laser bandpass filter excludes the center frequency of the laser energy.

In Example 7, the subject matter of Example 6 optionally includes a laser bandpass filter that includes a Lyot filter.

In Example 8, the subject matter of one or any combination of Examples 1-7 optionally includes a lens that includes alumina silicate glass or co-polymer coated poly(methyl methacrylate) (PMMA).

In Example 9, the subject matter of one or any combination of Examples 1-8 optionally includes an isolation barrier arranged on the substrate between the laser emitter and the photodiode, wherein the isolation barrier extends from the substrate to the top surface of the resin.

In Example 10, the subject matter of one or any combination of Examples 1-9 optionally includes logic circuitry configured to transmit and receive signals communicated according to a duplex communication protocol, and wherein the laser emitter, the photodiode, and the logic circuitry are included in a same electronics package.

In Example 11, the subject matter of one or any combination of Examples 1-10 optionally includes an optically clear resin (OCR) having a same refractive index as the lens.

Example 12 includes subject matter (such as a method of making an optical transmitter (TX) receiver (RX) pair), or can optionally be combined with one or any combination of Examples 1-11 to include such subject matter, comprising: arranging a photodiode and a laser emitter on a substrate, wherein laser energy emitted by the laser emitter has a center frequency; covering the photodiode and the laser emitter with an optically clear resin (OCR); and arranging a lens and a laser bandpass filter above the photodiode on a top surface of the OCR prior to curing of the OCR.

In Example 13, the subject matter of Example 12 optionally includes arranging a first lens portion having a first curvature above the photodiode and arranging a second lens portion having a second curvature arranged above the laser emitter.

In Example 14, the subject matter of one or both of Examples 12 and 13 optionally includes coating a surface of the lens to form the laser bandpass filter, wherein a passband of the laser bandpass filter excludes the center frequency of the laser energy.

In Example 15, the subject matter of Example 14 optionally includes forming a dichroic filter or a Lyot filter on the lens.

Example 16 can include subject matter (such as an apparatus), or can optionally be combined with one or any combination of Examples 1-15 to include such subject matter comprising an optical interface, the optical interface including: an optical interface host side including: a first substrate; a first laser emitter arranged on the first substrate, wherein laser energy emitted by the first laser emitter has a first center frequency; a first photodiode arranged on the first substrate, wherein the first laser emitter and first photodiode are incorporated in optically clear resin (OCR), wherein the OCR has a top surface; a first lens arranged on the top surface of the OCR; and a first laser bandpass filter arranged above the first photodiode; and an optical interface peripheral side separated from the optical interface host side by an air space, the interface peripheral side including: a second substrate; a second laser emitter arranged on the second substrate, wherein laser energy emitted by the laser emitter has a second center frequency; a second photodiode arranged on the second substrate wherein the second laser emitter and second photodiode are incorporated in OCR; a second lens arranged on the top surface of the OCR of the second substrate; and a second laser bandpass filter arranged above the second photodiode, wherein a passband of the second laser bandpass filter excludes the second center frequency and includes the first center frequency, and the passband of the first laser bandpass filter excludes the first center frequency and includes the second center frequency.

In Example 17, the subject matter of Example 16 can optionally include the first bandpass filter arranged on a surface of the first lens facing the OCR of the first substrate, and the second bandpass filter arranged on a surface of the second lens facing the OCR of the second substrate.

In Example 18, the subject matter of one or both of Examples 16 and 17 optionally includes logic circuitry electrically connected to one or both of the host side of the optical interface and the peripheral side of the optical interface, wherein the logic circuitry is configured to communicate signals via the optical interface according to a duplex communication protocol using the first laser emitter and the second photodiode as a first communication lane, and the second laser emitter and the first photodiode as a second communication lane.

In Example 19, the subject matter of one or any combination of Examples 16-18 optionally includes logic circuitry is configured to communicate signals via the optical interface according to a universal serial bus (USB) protocol.

In Example 20, the subject matter of one or any combination of Examples 16-19 optionally includes a first transimpedance amplifier (TIA) on the first substrate and a second TIA on the second substrate, wherein the first laser emitter, the second photodiode and the second TIA form a first communication lane, and the second laser emitter, the first photodiode and the first TIA form a second communication lane.

These several non-limiting embodiments and examples can be combined using any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    a substrate;
    a laser emitter arranged on the substrate;
    a photodiode arranged on the substrate;
    resin encapsulating the laser emitter and the photodiode, wherein the resin includes a top surface above the laser emitter and photodiode; and
    a lens arranged on the top surface of the resin, wherein the lens includes a first lens portion having a first curvature arranged above the photodiode and a second lens portion having a second curvature arranged above the laser emitter, and a structure with a bottom surface that is on the top surface of the resin, the bottom surface including a bandpass filter arranged above the photodiode but not the laser emitter.

2. The apparatus of claim 1, wherein the laser emitter emits laser energy having a center frequency, wherein the lens is arranged above the photodiode and includes a laser bandpass filter having a passband that excludes the center frequency of the laser energy.

3. The apparatus of claim 1, wherein the laser emitter includes a vertical cavity surface emitting laser (VCSEL) that emits laser energy having a center frequency, wherein the first lens portion includes a laser bandpass filter having a passband that excludes the center frequency of the laser energy.

4. The apparatus of claim 3, wherein the bandpass filter includes a dichroic filter.

5. The apparatus of claim 1, wherein the laser emitter emits laser energy having a center frequency, and wherein a passband of the laser bandpass filter excludes the center frequency of the laser energy.

6. The apparatus of claim 5, wherein t laser bandpass filter includes a Lyot filter.

7. The apparatus of claim 1, wherein the lens includes alumina silicate glass or co-polymer coated poly(methyl methacrylate) (PMMA).

8. The apparatus of claim 1, including an isolation barrier arranged on the substrate between the laser emitter and the photodiode, wherein the isolation barrier extends from the substrate to the top surface of the resin.

9. The apparatus of claim 1, including logic circuitry configured to transmit and receive signals communicated according to a duplex communication protocol, and wherein the laser emitter, the photodiode, and the logic circuitry are included in a same electronics package.

10. The apparatus of claim 1, wherein the resin is an optically clear resin (OCR) having a same refractive index as the lens.

11. A method comprising:
arranging a photodiode and a laser emitter on a substrate, wherein laser energy emitted by the laser emitter has a center frequency;
covering the photodiode and the laser emitter with an optically clear resin (OCR); and
arranging a lens above the photodiode on a top surface of the OCR prior to curing of the OCR, the lens including a first lens portion having a first curvature arranged above the photodiode, a second lens portion having a second curvature arranged above the laser emitter, and a structure with a bottom surface on the top surface of the resin, the bottom surface including a bandpass filter arranged above the photodiode but not the laser emitter.

12. The method of claim 11, including coating a surface of the lens to form the laser bandpass filter, wherein a passband of the laser bandpass filter excludes the center frequency of the laser energy.

13. The method of claim 12, wherein coating a surface of the lens to form the laser bandpass filter includes forming a dichroic filter or a Lyot filter on the lens.

14. An apparatus comprising an optical interface, the optical interface including:
an optical interface host side including:
a first substrate;
a first laser emitter arranged on the first substrate, wherein laser energy emitted by the first laser emitter has a first center frequency;
a first photodiode arranged on the first substrate, wherein the first laser emitter and first photodiode are incorporated in optically clear resin (OCR), wherein the OCR has a top surface;
a first lens arranged on the top surface of the OCR, wherein the first lens includes a first lens portion having a first curvature arranged above the photodiode, a second lens portion having a second curvature arranged above the laser emitter, and a structure with a bottom surface that is on the top surface of the resin; and
a first laser bandpass filter arranged on the bottom surface of the structure and above the first photodiode but not the first laser emitter; and
an optical interface peripheral side separated from the optical interface host side by an air space, the interface peripheral side including:
a second substrate;
a second laser emitter arranged on the second substrate, wherein laser energy emitted by the laser emitter has a second center frequency;
a second photodiode arranged on the second substrate wherein the second laser emitter and second photodiode are incorporated in OCR;
a second lens arranged on the top surface of the OCR of the second substrate, wherein the second lens includes a first lens portion having a first curvature arranged above the second photodiode, a second lens portion having a second curvature arranged above the second laser emitter, and a structure with a bottom surface that is on the top surface of the resin; and
a second laser bandpass filter arranged on the bottom surface of the structure and above the second photodiode but not the second laser emitter,
wherein a passband of the second laser bandpass filter excludes the second center frequency and includes the first center frequency, and the passband of the first laser bandpass filter excludes the first center frequency and includes the second center frequency.

15. The apparatus of claim 14, including logic circuitry electrically connected to one or both of the host side of the optical interface and the peripheral side of the optical interface, wherein the logic circuitry is configured to communicate signals via the optical interface according to a duplex communication protocol using the first laser emitter and the second photodiode as a first communication lane, and the second laser emitter and the first photodiode as a second communication lane.

16. The apparatus of claim 15, wherein the logic circuitry is configured to communicate signals via the optical interface according to a universal serial bus (USB) protocol.

17. The apparatus of claim 14, including a first transimpedance amplifier (TIA) on the first substrate and a second TIA on the second substrate, wherein the first laser emitter, the second photodiode and the second TIA form a first communication lane, and the second laser emitter, the first photodiode and the first TIA form a second communication lane.

\* \* \* \* \*

UNITED STATES PATENT AND TRADEMARK OFFICE
CERTIFICATE OF CORRECTION

PATENT NO. : 10,523,338 B2
APPLICATION NO. : 16/325154
DATED : December 31, 2019
INVENTOR(S) : Arvind Sundaram Page 1 of 1

It is certified that error appears in the above-identified patent and that said Letters Patent is hereby corrected as shown below:

In the Claims

In Column 8, Line 57, in Claim 4, after "the", insert --laser--

In Column 8, Line 63, in Claim 6, delete "t" and insert --the-- therefor

Signed and Sealed this
Twenty-seventh Day of August, 2024

Katherine Kelly Vidal
*Director of the United States Patent and Trademark Office*